(12) United States Patent
Himmelsbach et al.

(10) Patent No.: US 7,718,135 B2
(45) Date of Patent: May 18, 2010

(54) SAMPLE HOLDER FOR HOLDING AND TRANSPORTING A SAMPLE VIAL WITHIN AN NMR APPARATUS AND AUTOMATIC SUPPLY DEVICE FOR THE AUTOMATED EXCHANGE OF NMR SAMPLE VIALS AND METHOD OF OPERATION THEREOF

(75) Inventors: Kurt Himmelsbach, Fehraltdorf (CH); Franco Sestito, Winterthur (CH)

(73) Assignee: Bruker Biospin AG, Faellanden (CH)

( * ) Notice: Subject to any disclaimer, the term of this patent is extended or adjusted under 35 U.S.C. 154(b) by 513 days.

(21) Appl. No.: 11/700,944

(22) Filed: Feb. 1, 2007

(65) Prior Publication Data

US 2007/0202017 A1    Aug. 30, 2007

(30) Foreign Application Priority Data

Feb. 13, 2006    (DE) ................. 10 2006 006 705

(51) Int. Cl.
*B01L 9/00* (2006.01)
(52) U.S. Cl. .................. 422/104; 422/99; 422/102; 324/308; 505/844; 436/173; 435/307.1
(58) Field of Classification Search ............ 422/99, 422/102, 104; 324/307–315, 318, 321; 505/844; 436/173; 435/307.1
See application file for complete search history.

(56) References Cited

U.S. PATENT DOCUMENTS 4,581,583 A    4/1986    Vliet

| | | |
|---|---|---|
| 5,517,856 A | 5/1996 | Hofmann |
| 6,686,740 B2 | 2/2004 | Tschirky |
| 6,741,079 B2 | 5/2004 | Hofmann |
| 6,969,993 B2 | 11/2005 | Tschirky |

FOREIGN PATENT DOCUMENTS

| | | |
|---|---|---|
| JP | 54 074 795 | 6/1979 |
| JP | 54 119 287 | 9/1979 |
| WO | WO 92/15 899 | 9/1992 |

OTHER PUBLICATIONS

MR Resources: Bruker Sample Changers, [Online] 2005, URL: http://www.mrr.com/parts/bruker_samples_changer.shtm.

*Primary Examiner*—Jill Warden
*Assistant Examiner*—Shogo Sasaki
(74) *Attorney, Agent, or Firm*—Paul Vincent

(57) ABSTRACT

A sample holder for fixing and transporting a sample vial (1) within an NMR configuration comprising an outer shell (4) and a continuous hollow space disposed inside the outer shell (4) and extending along its axis for receiving the sample vial, is characterized in that a clamping device that can be switched on and off and a switching element (6) are provided inside the hollow space, wherein, in the activated state, the clamping device fixes a sample vial (1) that is introduced into the sample holder, the switching element (6) can be operated from the outside, and the clamping device can be deactivated using the switching element (6) such that, in the deactivated state, the sample vial (1) inserted into- or removed from the sample holder is not fixed. Such a sample holder may be used to realize an automatic supply device for changing NMR sample vials which has a very compact structure and can be mounted using little space.

6 Claims, 4 Drawing Sheets

SAMPLE HOLDER FOR HOLDING AND TRANSPORTING A SAMPLE VIAL WITHIN AN NMR APPARATUS AND AUTOMATIC SUPPLY DEVICE FOR THE AUTOMATED EXCHANGE OF NMR SAMPLE VIALS AND METHOD OF OPERATION THEREOF

This application claims Paris Convention priority of DE 10 2006 006 705.3 filed Feb. 13, 2006 the complete disclosure of which is hereby incorporated by reference.

BACKGROUND OF THE INVENTION

The invention concerns a sample holder for holding and transporting a sample vial within an NMR apparatus, comprising an outer shell and a continuous hollow space which is disposed inside the outer shell and extends along its axis, for receiving the sample vial, and an automatic supply device with an inventive sample holder for automated exchange of NMR sample vials, and methods of operation thereof.

A sample holder of this type is disclosed in U.S. Pat. No. 6,686,740 B2.

In NMR spectroscopy and, in particular, its industrial applications, large numbers of NMR samples must be measured automatically, i.e. without manual aid, in order to reduce personnel and improve the rate of utilization of the very expensive NMR spectrometers.

Such automated devices generally comprise a sample container which contains the NMR sample vials to be measured, with the measuring substances contained therein, a transport device, which grasps the sample holder containing the sample vial and transports it to the upper end of the room temperature bore (RT bore) of the NMR magnet, or a transport robot that removes the sample vial from a sample container and transports it to a supply device which inserts the sample vial into a sample holder, with the transport robot then transporting the sample holder, including sample vial, to the upper end of the RT bore, where the sample holder, including sample vial, is received by an air cushion device, transported on an air cushion from the upper end of the RT bore to the measuring chamber inside an RT bore, and returned to the upper end of the RT bore after measurement.

The air cushion device cooperates closely with a "docking device" (dock unit) which can i.a. receive and fix the probe head. The dock unit is located inside the RT bore and extends along its entire length. It contains the RT shim system and any gradient coils and has a cylindrical opening at its lower end into which the desired probe head can be inserted and fixed. The upper part of the dock unit has a cylindrical tube with an opening which opens to the outside at the upper end and through which the sample vial may be transported down to the measuring chamber. Compressed air is supplied below at the dock unit, which rotates the sample vial by means of an air turbine and also generates an air flow for the air cushion device. This air flows upwards along the tube that leads to the cylindrical opening at the upper end of the dock unit and escapes to the outside.

The maximum outer dimensions of the sample holder are important for the correct function of the air cushion device. It must fit into the upper opening of the dock unit with little play to prevent an excessive amount of air from escaping to the side. This produces an air cushion below the sample holder on which the sample holder including sample vial may be supported and slide downwards and upwards by reducing or increasing the air pressure.

There is an associated sample holder for any sample vial diameter, which is constructed such that its outer dimensions are preferably the same, irrespective of the diameter of the sample vial.

So-called "spinners" and "shuttles" are currently used as sample holders. In a spinner, the sample vial is rigidly clamped in the spinner, which, in turn, is formed such that it can be inserted into the upper opening of the dock unit with little play, and additionally also comes to rest exactly on the air turbine of the dock unit. The sample vial is thereby correctly positioned and centered. If required, the sample vial including spinner may be rotated using the air turbine in order to cancel inhomogeneities in the static magnetic field $B_0$. This requires, however, that the spinner and the sample vial have a very high axial symmetry and their symmetry axes are disposed exactly on top of each other to produce rotation about a stable axis of rotation.

In the device of U.S. Pat. No. 6,686,740 B2, the sample vial whose diameter is preferably in a range between 1 and 3 mm, is loosely disposed in the shuttle, wherein a sleeve which closes the upper opening of the sample vial comes to rest on a shoulder within the shuttle. For this reason, the sample vial cannot fall downwards out of the shuttle. Loose positioning of the sample vial in the shuttle provides axial lateral and downward flexibility which considerably decreases the danger of breaking the sample vial during transport into the measuring chamber. The outer diameter of the shuttle is also dimensioned such that it can be inserted with little play into the upper opening of the dock unit. Rotation of the sample vial is not provided in this case. The outer shape of the shuttle is preferably selected to be the same as that of the spinner such that both sample holders, spinner and shuttle may be appropriately supported on the air turbine of the dock unit.

The sleeve at the top of the sample vial may also be used to hermetically seal the measuring substance inside the sample vial from the outside, in order to prevent the measuring substance from evaporating. It also permits application of an identification code (e.g. DOT matrix code) on the upper surface of the sleeve. Such an identification code is very convenient for automated sample exchange, since it defines i.a. the required adjustments of the NMR parameters during the measurement.

In some of the conventional devices for changing the NMR sample vial, each sample vial to be measured is initially manually associated with one respective sample holder (either spinner or shuttle) into which it is inserted. A transport device subsequently moves one of the sample holders, including the sample vial, from the sample container to the upper outlet of the docking unit where it is transported by the air cushion device into the measuring area.

These devices have the following serious drawbacks. Since the unit consisting of sample holder and sample vial requires a storage space that is up to 25 times larger than the sample vial alone, the sample containers must either be very large or be provided with fewer units, which is highly disadvantageous. Moreover, each sample vial requires its own sample holder such that a large number of "spinners" or "shuttles" must be provided which involves relatively high costs.

Moreover, manual supply of the sample holder with a sample vial is time-consuming and is an additional burden for the staff, and should therefore be prevented to optimize automated operation.

In order to avoid these drawbacks, modern devices automatically supply the sample holder with a sample vial and also transfer the sample holder including sample vial to the air cushion device. Supply is effected with a controlled supply robot. It grasps an individual sample vial from the sample container which exclusively contains sample vials, and inserts it from above into the sample holder. When the sample holder is a conventional spinner, the sample vial must normally be pushed through a rubber ring or another passive clamping device which is located inside the spinner and is designed to fix the sample vial. Considerable frictional forces are thereby produced between the sample vial and the clamping device. The supply robot subsequently transfers the sample holder including sample vial to the transport device which disposes this unit onto the air cushion above the RT bore of the magnet, and further handling is effected by the air cushion device.

After measurement, the sample holder including sample vial are transported to the top by the air cushion device, taken over by the transport device and returned by the latter to the supply robot which removes the sample vial from the sample holder. This process is associated with considerable friction forces when a conventional spinner is used. If the supply robot performs this process by rigidly clamping the upper end of the sample vial and subsequently drawing the sample vial out of the spinner, the sample vial can be easily broken. For this reason, the supply robot must have access to the lower end of the sample vial in order to push the sample vial out of the rubber ring or the passive clamping device through one upward pushing motion. The robot must subsequently move again upwards, grasp the loose sample vial and return it to the sample holder.

In the above-described device it is therefore important that the sample vial is inserted and removed by one pushing action each, since only in this way can the danger be minimized that the sample vial breaks or the gripper slides off the tube.

These devices have the following disadvantages. The supply robot must have access to the lower end of the sample vial when the sample vial is removed from the spinner, in order to release the sample vial from the clamping action of the spinner through one pushing motion from below.

In addition to the supply robot which is also responsible for transporting the sample vial from the sample container to the supply device, the device also requires a transport device i.e. a total of two automated systems.

Moreover, the overall device requires a large amount of space as well as its own, sometimes very large, assembly frame.

These devices additionally use conventional spinners as sample holders, as are used for manual operation, or spinners whose function resembles that of conventional spinners, which has the following further disadvantages. The force required by the device for inserting the sample tube into such a spinner is relatively large. This force is a consequence of the high contact pressure between the spinner and the sample vial which is required to obtain high precision coincidence between the symmetry axes of the sample tube and of the spinner in order to assure proper rotation. The large contact pressure generates large frictional forces between the spinner and the sample vial and wears the spinner, in particular, of the second described device that has a supply robot and requires one single spinner for all sample vials of the same diameter.

It is the underlying purpose of the invention to propose a sample holder in an automatic supply device for changing NMR sample vials that avoids the above-mentioned disadvantages, has a very compact construction, and can be mounted requiring little space.

SUMMARY OF THE INVENTION

This object is achieved in accordance with the invention with a sample holder which has a releasable clamping device and a switching element within the hollow space, wherein, in the activated state, the clamping device fixes a sample vial which is inserted into the sample holder, wherein the switching element can be actuated from the outside, and the clamping device can be deactivated by the switching element, such that the sample vial that is inserted into the sample holder is not fixed in the deactivated state.

In one particularly preferred embodiment, the clamping device comprises a mounting ring which is connected to elastic blades which, in turn, have clamping fittings at their ends, wherein the clamping device is fixed by the mounting ring in the hollow space of the sample holder, and wherein the clamping fittings of the clamping device can be axially displaced by the switching element via inner conical transmission surfaces of the outer shell, such that the clamping fittings can be radially deflected and the clamping device can be activated.

In order to facilitate handling of the device, the clamping device can advantageously be axially shifted from the upper edge of the sample holder.

In a preferred embodiment, transmission pins are provided which are disposed inside the hollow space of the outer shell and transmit the axial displacement of the switching element onto the clamping device.

In a simple but particularly effective embodiment, a spring element is provided which is disposed between a lower shoulder of the outer shell and the mounting ring of the clamping device, and provides a force for activating the clamping device, wherein the force exerted by the spring element onto the mounting ring counteracts the force which acts on the clamping device through actuating the switching element.

The spring element advantageously comprises a rubber ring.

In order to avoid balance errors during rotation of the sample holder including sample vial, and in order to realize a clamping force which uniformly acts on the sample vial, each structural member of the sample holder is advantageously disposed symmetrically about the axis of the sample holder.

In a particularly preferred embodiment, the free inner space of the clamping device is adjusted to the outer diameter of the sample vial. With particular preference, the inner diameter of the hollow space is additionally adjusted to the new dimensions of the altered clamping device. In this fashion, it is possible to use sample vials having different outer diameters without impairing the retaining force of the device.

The switching element preferably has a shoulder at its lower end onto which the closing sleeve of the sample vial may abut.

The sample holder is preferably designed as a spinner or a shuttle.

A further aspect of the present invention is to realize a compact automated supply device for NMR apparatus. This is achieved in that access to the lower area of the supply device is not required during the supply process. Such a supply device consists of an inventive sample holder and a robot for removing a sample vial from a sample container and for supplying, inserting and removing the sample vial into and from the sample holder, and a fixing device within which the sample holder is disposed and can be fixed by the fixing device.

Since access to the supply device from below is not required during the supply process, the fixing device may preferably be mounted directly above a cryostat of the NMR apparatus at the upper end of a dock unit disposed in a room temperature bore of the NMR apparatus.

In a particularly preferred embodiment of the inventive automated supply device, the fixing device has first sliders as a stop for the switching element and the outer shell of the sample holder, and first pneumatic cylinders, wherein the first sliders can be shifted in a horizontal direction by the first pneumatic cylinders. This facilitates exchange of the sample holder.

In a particularly advantageous fashion, the fixing device has second sliders and second pneumatic cylinders, wherein the second slider can be shifted by the second pneumatic cylinders in a horizontal direction such that, when the second sliders are shifted in a radial inward direction, the second sliders contact outer conical surfaces of the outer shell of the sample holder. In this fashion, the sample holder can be fixed and released.

In a special embodiment, the pneumatic cylinders of the fixing device can be automatically controlled.

The invention also concerns a method for supplying an NMR apparatus using an above-described inventive automated supply device, wherein the robot removes a sample vial containing a measuring substance from a sample container, and inserts it into the sample holder in such a fashion that the axis of the sample vial coincides with the axis of the sample holder, wherein, after positioning the sample vial in the sample holder, the second sliders are shifted radially outwards in a horizontal direction by the second pneumatic cylinders, such that the contact between the second sliders and the outer conical surfaces of the outer shell of the sample holder is released, and the sample holder moves downwards due to gravity, and wherein the spring element between the outer shell of the sample holder and the mounting ring of the clamping device is relaxed and the clamping fittings are driven against the inner conical transmission surfaces by the upward force of the spring element acting on the clamping device, and are deflected in a radial inward direction, such that the sample vial is fixed in the clamping device.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 2:
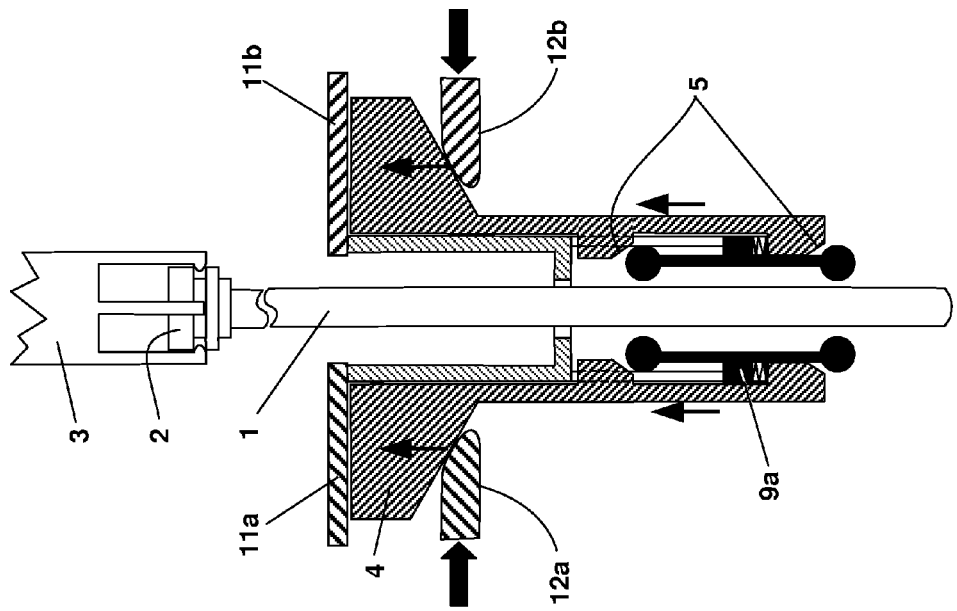
FIG. 2 shows the sample holder of FIG. 1 with deactivated clamping device.

It is the underlying purpose of the inventive device to realize an operating system for automated exchange of NMR sample vials which has very compact construction and can therefore be completely mounted in the upper area of the cryostat. The key element for obtaining this aim is a specially constructed supply device (supplier), wherein the robot requires no access to the lower area of the supplier during supply. For this reason, the supplier may be mounted directly above the RT bore of the cryostat which considerably reduces the required space.

Since the robot and the probe container also require little space, they may also be mounted or positioned above the cryostat and close to the supplier. In this fashion, an overall compact supplying system is produced which does not require a large assembly frame.

The supplier consists of a fixing device which has a simple control system for retaining or releasing a specially constructed inventive sample holder, and switching on or off a clamping device inside the sample holder.

The inventive sample holder may be designed as a "spinner" or a "shuttle" and has varying inner dimensions but identical outer dimensions depending on the diameter of the sample vial and on the purpose of use, i.e. whether it is used as a "spinner" or "shuttle", in order to prevent any compatibility problems with the existing dock unit and the probe head.

The inventive sample holder has an inner continuous hollow space that extends along its axis of rotation, and in which a mechanical clamping device is housed which can be switched on or off from the outside. The clamping device either releases the sample vial (deactivated state) or retains it in a precise fashion, such that the axis of the sample holder and that of the sample vial coincide with optimum exactness (activated state).

The clamping device is switched on or off using a switching element 6 that is located in the hollow space of the sample holder, which can be axially displaced from the outside and can be operated from the upper edge of the sample holder to transmit the axial displacement onto the clamping device. The clamping device, in turn, transforms the axial displacement, via conical transmission surfaces 5, into a radial displacement of its clamping fittings 9c to retain or release the sample vial.

The axial displacement of the switching element 6 is preferably transferred to the clamping device via several transmission pins 8a, 8e, which provide a connection to the clamping device via axial bores through the upper conical surface 5.

The force required by the clamping device for retaining the sample vial may preferably be provided by a spring element 10 which preferably consists of a rubber ring.

All components associated with the sample holder either have a common axis of symmetry which coincides with the axis of rotation of the sample holder, or when groups of structural components are used (e.g. transmission pins 8a, 8e), the individual structural components are disposed symmetrically and uniformly about the axis of rotation of the sample holder.

Figure 1:
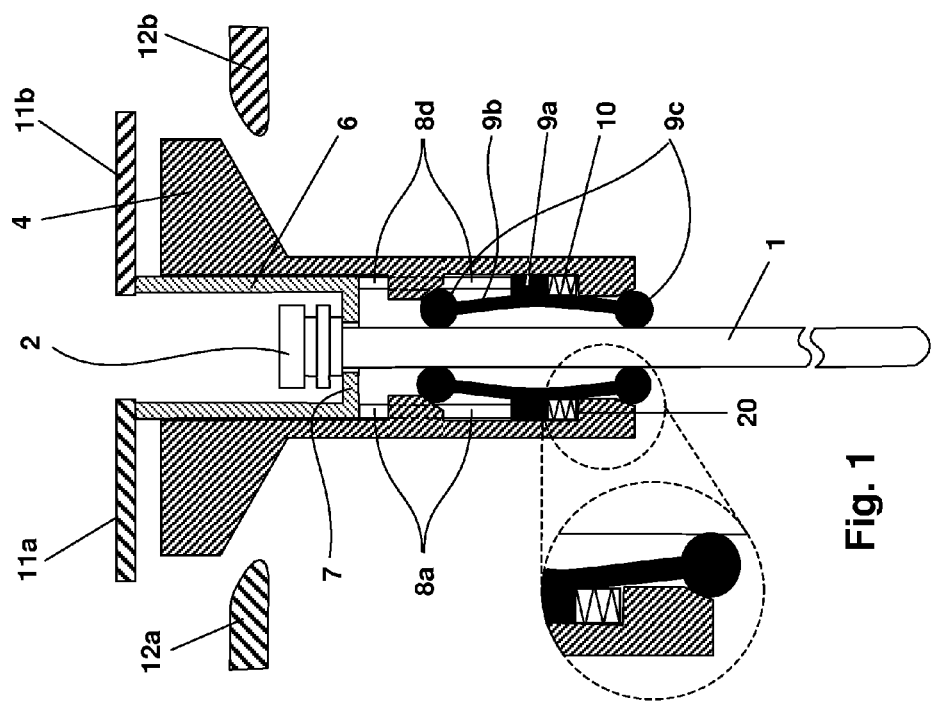
FIG. 1 shows a sectional side view of an inventive sample holder with activated clamping device.

FIGS. 1 and 2 show a preferred embodiment of the sample holder. FIG. 1 shows the sample holder with switched-on clamping device and FIG. 2 with switched-off clamping device. The principal components of the sample holder are:

1. outer shell 4 which has two bevelled surfaces 5 in its inner hollow space.
2. clamping device consisting of mounting ring 9a, elastic blades 9b and fittings 9c which are located at the two ends of the blades 9b. When the clamping device is switched on, these fittings are clamped between the sample vial and the outer shell 4 and thereby produce a firm connection between these two parts.
3. switching element 6 which has a shoulder 7 at its lower end. It defines the position of the sample vial within the sample holder using the closure sleeve 2 and also prevents the sample vials from falling out of the sample holder.
4. Transmission pins 8a, 8e which transmit the axial displacement of the switching element 6 relative to the outer shell 4 to the mounting ring 9a, such that the mounting ring 9a always moves axially synchronously to the switching element 6.
5. Spring element 10 which must generate the required force for clamping the sample vial when the clamping device is switched on. The spring element 10 is disposed between a lower shoulder 20 of said outer shell 4 and the mounting ring 9a of the clamping device to exert a force for activating the clamping device.

The switching element 6 is relieved to switch on the clamping device (FIG. 1), i.e. no external force acts on it, such that the spring effect of the spring element 10 forces the mounting ring 9a upwards. This forces the fittings 9c between the bevelled surfaces 5 and the sample vial, which thereby generate the desired solid connection between the sample vial and the outer shell 4.

For switching off the clamping device, the switching element 6 is forced downwards into the outer shell 4. The transmission pins 8a to 8e transmit this motion to the mounting ring 9 which is thereby forced downwards and removes the fittings 9c from the conical surfaces 5. The contact between the sample vial and the outer shell 4 is thereby cancelled and the sample vial is released.

FIG. 2 shows the preferred procedure for switching off the clamping device. It corresponds exactly to the above-described procedure in view of the motions of the individual parts relative to each other. In FIG. 2, the switching element 6 including transmission pins 8a, 8e and mounting ring 9 are held at a constant position and only the outer shell 4 is pushed upwards via the sliders 12a and 12b. The conical surfaces 5 are thereby removed from the fittings 9c, the contact between the sample vial and the outer shell 4 is interrupted, and the sample vial is released.

Figure 3:
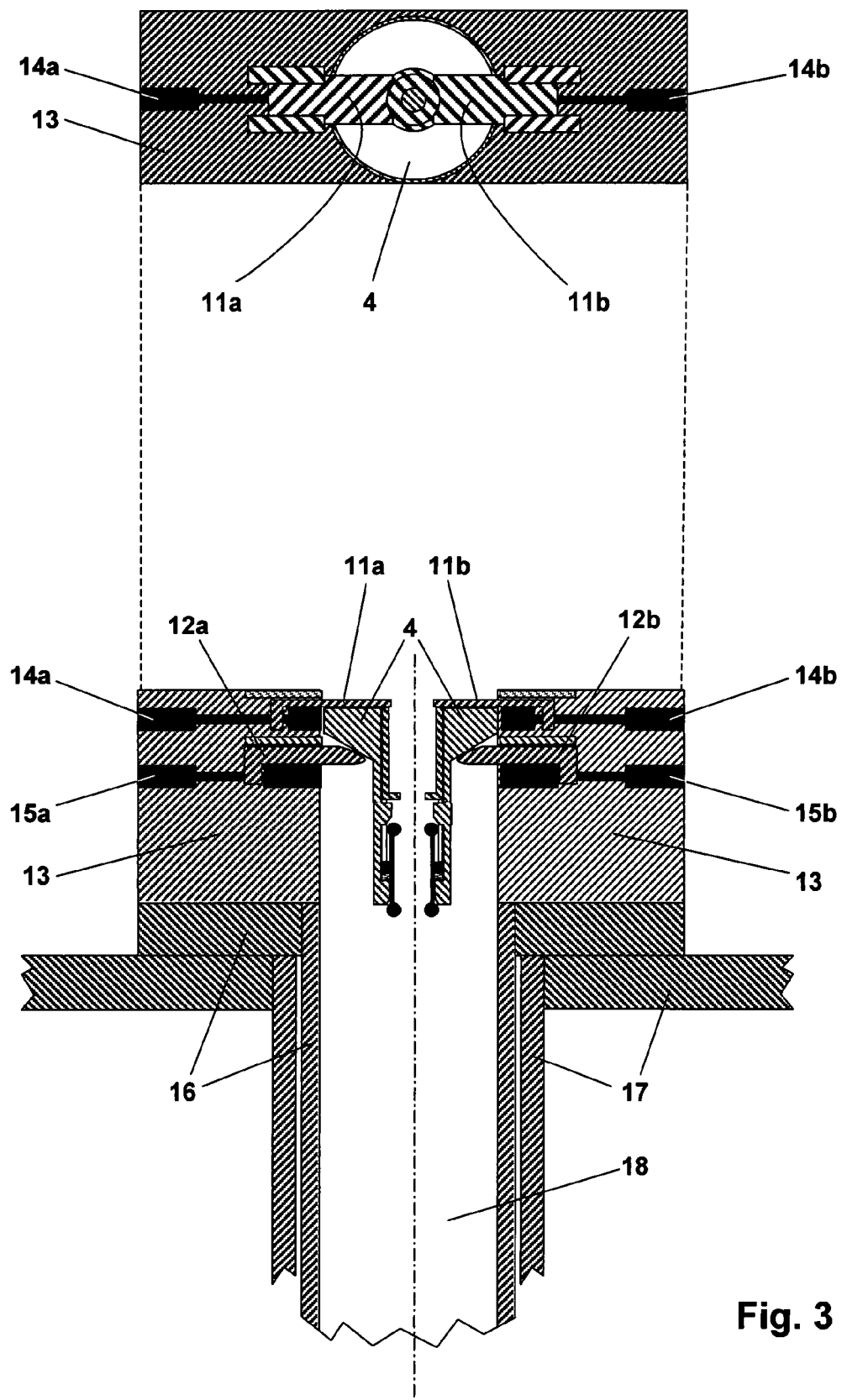
FIG. 3 shows a top view and a sectional side view of an inventive fixing device with sample holder and deactivated clamping device.

FIG. 3 shows a preferred embodiment of the inventive fixing device. Two pneumatic cylinders 14a and 14b actuate two sliders 11a and 11b which define the stop for the switching element 6 and the outer shell 4. These two sliders are normally in the extended state and are returned only when the sample holder must be exchanged (e.g. for changing between "spinner" and "shuttle" or when another sample vial diameter is desired). The two pneumatic cylinders 15a and 15b actuate the two sliders 12a and 12b which force the outer shell 4 towards the two sliders 11a and 11b via the outer conical surface.

Figure 4C:
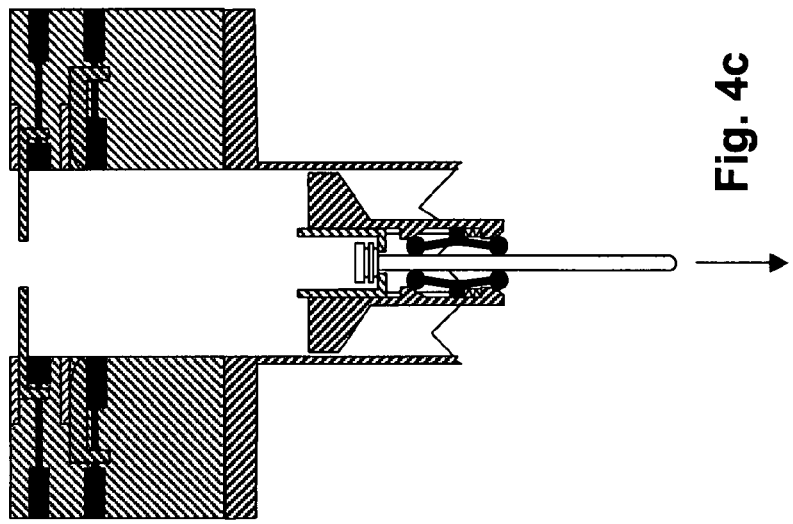
FIGS. 4a-c show schematic views of the inventive method for automatic supply of an NMR apparatus using an inventive supply device, wherein a sample vial is transported inside the NMR apparatus.
Figure 4B:
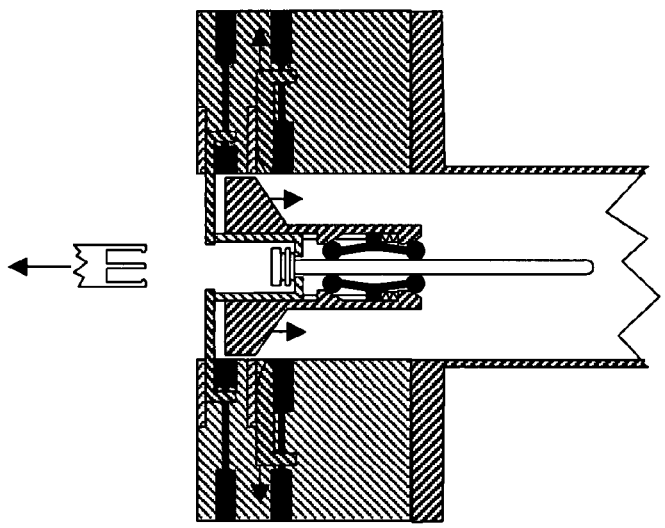
Figure 4A:
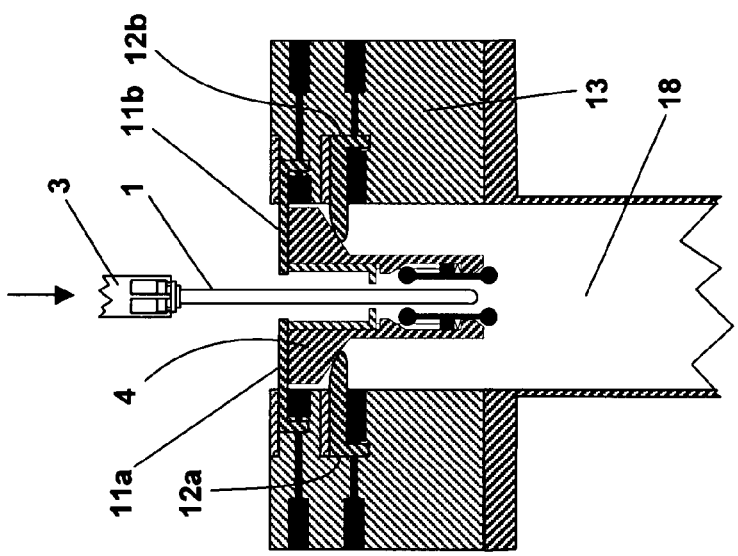

The supply and removal process is described in individual steps below:
1. Initial state: The empty sample holder is located in the fixing device and is retained by the two extended sliders 12a and 12b. The clamping device is thereby deactivated.
2. The air cushion device is activated, i.e. the compressed air is switched on.
3. The robot grasps a sample vial using gripping tongs 3 from a sample container, transports it to the fixing device and inserts it from above into the sample holder until it has reached the desired position (FIG. 4a).
4. The fixing device moves the two sliders 12a and 12b back, whereby the outer shell is pressed downwards by the spring element 10, the clamping device is switched on and the sample vial is retained (FIG. 4b). From now on, the sample vials and sample holders are both held and supported by the robot.
5. The robot releases the gripping tongs 3 such that the sample holder including sample vial is only held by the air cushion of the air cushion device (FIG. 4b).
6. The sample holder including sample vial is supplied by the air cushion device down into the measuring chamber (FIG. 4c), where it comes to rest on the stator of the air turbine of the probe head.
7. The air cushion device is deactivated, i.e. the compressed air is switched off and the measuring process may be started.

Figure 5C:
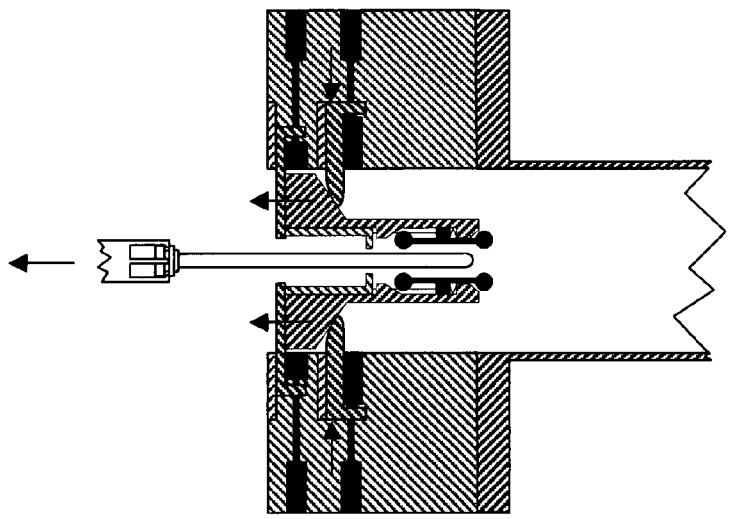
FIGS. 5a-c show schematic views of the inventive method for automatic supply of an NMR apparatus using an inventive supply device, wherein a sample holder is transported from the inside of the NMR apparatus.
Figure 5B:
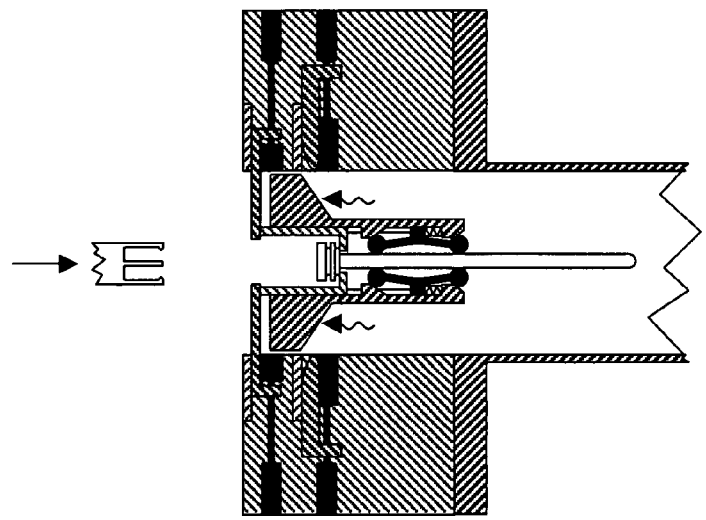
Figure 5A:
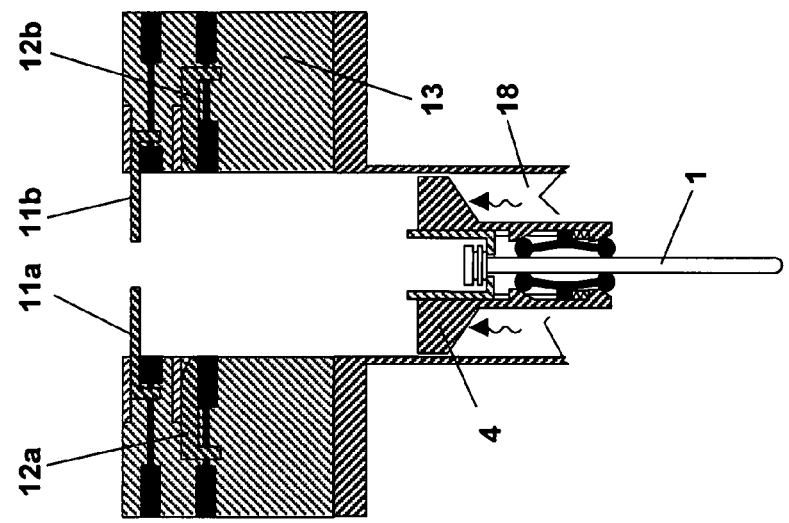

The measuring process is followed by the removal process.
8. The air cushion device is activated again, i.e. the compressed air is switched on again.
9. The sample holder including sample vial are returned to the fixing device using the air cushion device (FIG. 5a), are stopped by the two sliders 11a and 11b at the upper end of the fixing device, and are held in this position by the air pressure of the air cushion device (FIG. 5b).
10. The robot grasps the sample vial using the gripping tongs 3 without changing its position (FIG. 5b).
11. The fixing device extends again the two sliders 12a and 12 and thereby switches off the clamping device (FIG. 5c). The sample vial is now held and supported only by the robot.
12. The robot guides the sample vial out of the sample holder (FIG. 5c) and returns it to the sample holder.
13. Continuation at point 3.

The inventive device differs from prior art in the following ways:
the inventive sample holder contains a clamping device in its inside which acts on the sample vial and may be switched on or off automatically.
the inventive fixing device fixes the sample holder and also switches the clamping device of the inventive sample holder on or off.
since the inventive supply device has an automatic clamping device in the sample holder, the robot requires no access to the lower area of the supplier and may therefore be mounted directly above the cryostat at the upper end of the docking unit.
the inventive sample holder is constructed such that the upper part of the sample vial can be immersed into the inventive sample holder, such that short sample vials of a length of preferably 100 to 120 mm may be used.
all elements of the inventive supply device may be mounted directly on the cryostat of the superconducting NMR magnet.

LIST OF REFERENCE NUMERALS

1 sample vial
2 closure sleeve of the sample vial 1
3 gripping tongs for holding the closure sleeve 2
4 outer shell of the sample holder
5 bevelled surfaces in the inner hollow space of the sample holder
6 switching element which may be actuated from the upper edge of the sample holder and serves for switching on and off the clamping device 9a, 9b, 9c
7 shoulder at the lower edge of the switching element which serves as stop for the closure sleeve 2 and prevents the sample vial from falling down
8a, 8e transmission pins (preferably 6 pieces uniformly distributed over the periphery) which transmit the axial displacement of the switching element 6 to the mounting ring 9a of the clamping device
9a mounting ring which holds the blades 9b together 9b elastic blades of the clamping device (preferably 9 pieces uniformly distributed over the periphery)
9c fittings mounted to the two ends of the elastic blades 9b
10 spring element, preferably consisting of a rubber ring
11a, 11b first sliders which are mounted at the very top of the fixing device and serve as stop for the outer shell 4 and the switching element 6
12a, 12b second sliders which are mounted within the fixing device and may be used for switching on and off the clamping device
13 fixing device
14a, 14b first pneumatic cylinders for operating the sliders 11a and 11b
15a, 15b second pneumatic cylinders for operating the sliders 12a and 12b
16 docking unit
17 cryostat which contains the superconducting NMR magnet
18 cylindrical shaft through which the sample holder including sample vial are supplied on an air cushion into the measuring chamber

We claim:

1. A sample holder for fixing and transporting a sample vial within a nuclear magnetic resonance (NMR) configuration, the sample holder comprising:
    an outer shell having an inner surface and a continuous inner hollow space extending in an axial direction thereof for receiving a sample vial, said outer shell having a distal end and a proximal end, wherein shoulders comprising beveled transmission surfaces are provided at said inner surface, and an upper edge is provided at said proximal end;
    a switching element disposed within said hollow space, said switching element having a distal end and a proximal end, wherein said switching element is axially displaceable within said continuous inner hollow space of said outer shell from said outer shell upper edge towards said outer shell distal end;
    a clamping device cooperating with said switching element, said clamping device disposed within said hollow space of said outer shell, said clamping device comprising elastic blades having clamping fittings and a mounting ring connected to said elastic blades, wherein said clamping device is axially displaceable within said outer shell and said clamp fittings contact said beveled transmission surfaces of said outer shell;
    transmission pins disposed inside said hollow space of said outer shell between said distal end of said switching element and said mounting ring of said clamping device to transmit an axial displacement of said switching element to said clamping device; and
    spring elements disposed between said shoulders of said outer shell and said mounting ring of said clamping device to exert force on said mounting ring counteracting force exerted onto said clamping device through axial displacement of said switching element towards said distal end of said outer shell, wherein said clamping fittings of said clamping device are deflected inwardly towards a center axis of said outer shell within said inner hollow space of said outer shell by said beveled transmission surfaces of said shoulders via axial displacement of said switching element towards said proximal end of said outer shell via said counteracting force exerted by said spring, said clamping fittings of said clamping device are deflected outwardly towards said inner surface of said outer shell within said inner hollow space of said outer shell via axial displacement of said switching element towards said distal end of said outer shell.

2. The sample holder of claim 1, wherein said spring element comprises a rubber ring.

3. The sample holder of claim 1, wherein the structural members of the sample holder are each symmetrically disposed about a central axis of the sample holder.

4. The sample holder of claim 1, wherein said switching element has a shoulder at said distal end onto which a closing sleeve of the sample vial abuts.

5. The sample holder of claim 1, wherein the sample holder is designed as a spinner or a shuttle for the NMR configuration.

6. An automated supply device for an NMR apparatus, which inserts and removes a sample vial from the NMR apparatus, the device comprising:
    a sample holder, wherein the sample holder comprises:
        an outer shell having an inner surface and a continuous inner hollow space extending in an axial direction thereof for receiving a sample vial, said outer shell having a distal end and a proximal end, wherein shoulders comprising beveled transmission surfaces are provided at said inner surface, said outer shell also having an upper edge provided at the proximal end and comprising conical transmission surfaces;
        a switching element disposed partially within said hollow space, said switching element having a distal end and a proximal end, wherein said switching element is axially displaceable within said continuous inner hollow space of said outer shell from said outer shell upper edge towards said outer shell distal end and said switching element proximal end is disposed outside of said outer shell upper edge;
        a clamping device cooperating with said switching element, said clamping device disposed within said hollow space of said outer shell, said clamping device comprising elastic blades having clamping fittings and a mounting ring connected to said elastic blades, wherein said clamping device is axially displaceable within said outer shell and said clamp fittings contact said beveled transmission surfaces;
        transmission pins disposed inside said hollow space of said outer shell between said distal end of said switching element and said mounting ring of said claming device to transmit an axial displacement of said switching element to said clamping device;
        spring elements disposed between said shoulders of said outer shell and said mounting ring of said clamping device to exert force on said mounting ring counteracting force exerted onto said clamping device through axial displacement of said switching element towards said distal end of said outer shell, wherein said clamping fittings of said clamping device are deflected inwardly towards a center axis of said outer shell within said inner hollow space of said outer shell by said beveled transmission surfaces of said shoulders via axial displacement of said switching element towards said proximal end of said outer shell via said counteracting force exerted by said spring, said clamping fittings of said clamping device are deflected outwardly towards said inner surface of said outer shell within said inner hollow space of said outer shell via axial displacement of said switching element towards said distal end of said outer shell; and
    a fixing device within which the sample holder is disposed, said fixing device comprising:

first sliders, which function as a stop for said proximal end of said switching element and for said upper edge of said outer shell;

first pneumatic cylinders, wherein said first sliders are displaced by said first pneumatic cylinders;

second sliders;

second pneumatic cylinders, wherein said second sliders are displaced by said second pneumatic cylinders to exert force onto said conical transmission surfaces of said outer shell of the sample holder, thereby actuating said switching element.

* * * * *